United States Patent
Ku et al.

(10) Patent No.: US 7,463,534 B2
(45) Date of Patent: Dec. 9, 2008

(54) WRITE APPARATUS FOR DDR SDRAM SEMICONDUCTOR MEMORY DEVICE

(75) Inventors: Kie Bong Ku, Cheongju-si (KR); Kwang Jun Cho, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 84 days.

(21) Appl. No.: 11/687,285

(22) Filed: Mar. 16, 2007

(65) Prior Publication Data

US 2007/0242531 A1 Oct. 18, 2007

(30) Foreign Application Priority Data

Apr. 18, 2006 (KR) .................. 10-2006-0034984

(51) Int. Cl.
*G11C 7/10* (2006.01)
(52) U.S. Cl. .................. 365/189.011; 365/189.05; 365/193; 365/194; 365/233.13
(58) Field of Classification Search .......... 365/189.011, 365/189.05, 193, 194, 233.1, 233.13
See application file for complete search history.

(56) References Cited

U.S. PATENT DOCUMENTS

| | | | | |
|---|---|---|---|---|
| 6,909,643 | B2 * | 6/2005 | Kwean | 365/193 |
| 7,016,256 | B2 * | 3/2006 | Yoon et al. | 365/189.16 |
| 7,042,799 | B2 | 5/2006 | Cho | |
| 7,050,352 | B2 | 5/2006 | Cha | |
| 7,369,455 | B2 * | 5/2008 | Nam | 365/230.08 |
| 2004/0264291 | A1 * | 12/2004 | Shim | 365/233 |
| 2005/0254307 | A1 | 11/2005 | Dietrich et al. | |

FOREIGN PATENT DOCUMENTS

| | | |
|---|---|---|
| KR | 1020020086197 | 11/2002 |
| KR | 1020030089181 | 11/2003 |

OTHER PUBLICATIONS

Notice of Allowance for Korean patent app. 2006-34984.

* cited by examiner

*Primary Examiner*—Richard Elms
*Assistant Examiner*—Toan Le
(74) *Attorney, Agent, or Firm*—Lowe Hauptman Ham & Berner LLP (57) ABSTRACT

A writing apparatus of a semiconductor memory device includes a pulse generator, a latch unit and an output latch unit. The pulse generator outputs a first pulse every rising edge of a data strobe pulse and a second pulse every falling edge of the data strobe pulse, respectively. The latch unit latches data input every rising edge of the first pulse, latches data input every rising edge of the second pulse and the latched data, respectively, and allocates the latched data to first and second data lines. The output latch unit latches data, which are firstly allocated to the first and second data lines, in response to a first control signal, and latches data, which are secondly allocated to the first and second data lines, in response to a second control signal.

13 Claims, 9 Drawing Sheets

WRITE APPARATUS FOR DDR SDRAM SEMICONDUCTOR MEMORY DEVICE

CROSS-REFERENCES TO RELATED APPLICATIONS

The present application claims priority to Korean patent application number 10-2006-034984, filed on Apr. 18, 2006, which is incorporated by reference in its entirety.

BACKGROUND OF THE INVENTION

The present invention relates, in general, to semiconductor memory devices and, more particularly, to a write apparatus of Double Data Rate Synchronous DRAM (DDR SDRAM).

Recently, DDR SDRAM has been in the spotlight since it has a high operating speed compared with conventional SDRAM. In general, in DDR SDRAM, data are input and output in synchronization with the rising or falling edge of a clock. However, four register signals must be latched in parallel. It increases the number of signals, resulting in an increased area of the circuit. Furthermore, since the number of operating circuits is increased, a necessary amount of current is increased.

Figure 1:
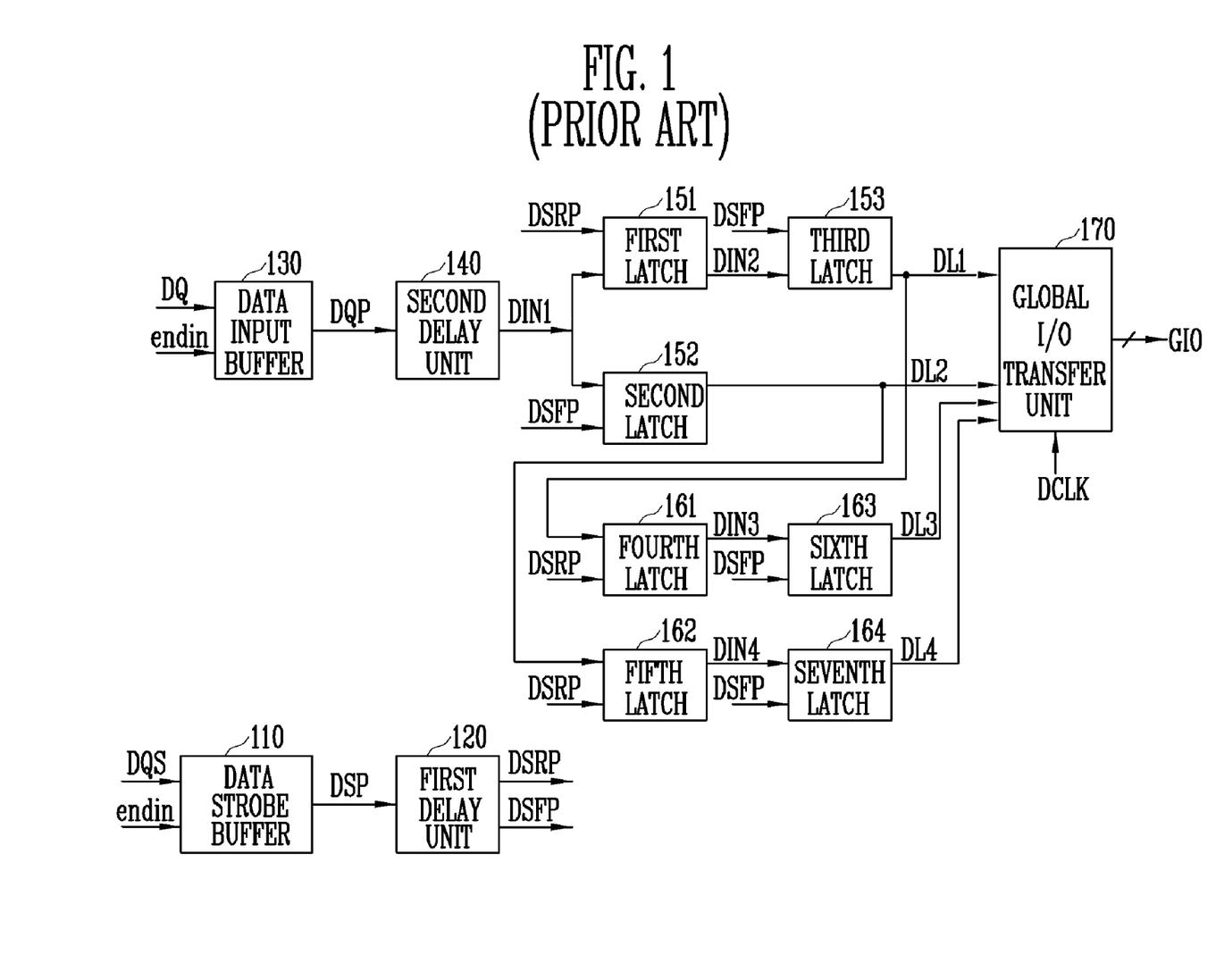
FIG. 1 is a block diagram schematically showing a data write apparatus in conventional DDR SDRAM.
Figure 2:
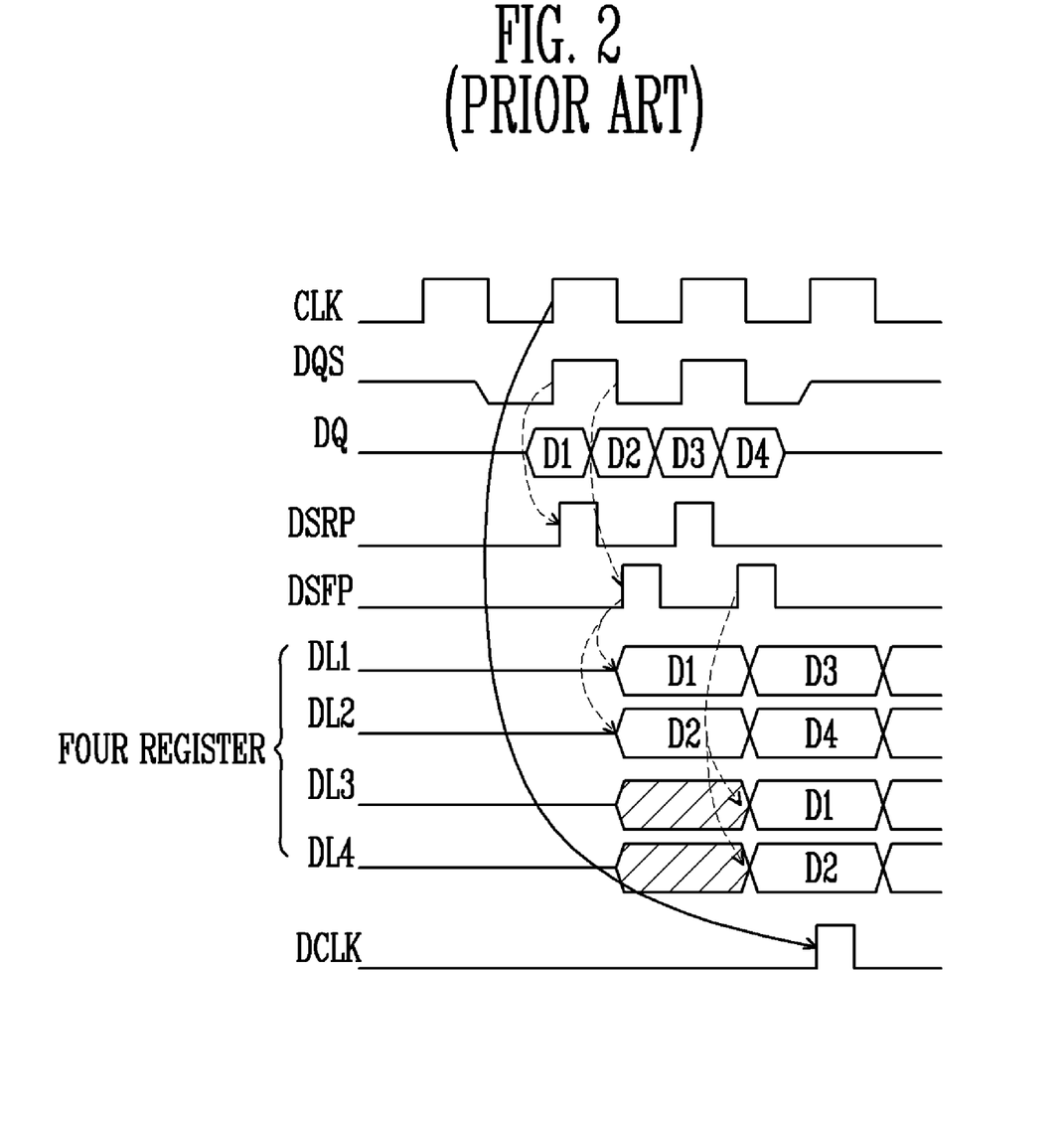
FIG. 2 is a timing diagram illustrating a data write operation of the data write apparatus show in FIG. 1.

FIG. 1 is a block diagram schematically showing a data write apparatus in conventional DDR SDRAM. The data write apparatus includes a data strobe buffer 110, a first delay unit 120, a data input buffer 130, a second delay unit 140, latch units 151 to 153 and 161 to 164, and a global I/O transfer unit 170. The data strobe buffer 110 buffers a data strobe pulse DQS in response to an enable signal endin. The first delay unit 120 outputs a rising sense signal DSRP and a falling sense signal DSFP in response to a strobe output pulse DSP output from the data strobe buffer 110. The data input buffer 130 has an input terminal DQ for receiving and buffering input data in response to the enable signal endin. The second delay unit 140 controls set-up or hold characteristics and allocates data to a first input line DIN1 in response to an input strobe pulse DQP. The first latch 151 latches data and transfers the data to a second input line DIN2, in response to the rising sense signal DSRP. The second latch 152 latches data and allocates the data to a second data line DL2 in response to the falling sense signal DSFP. The third latch 153 latches data and allocates the data to a first data line DL1 in response to the falling sense signal DSFP. The fourth latch 161 latches data in response to the rising sense signal DSRP. The fifth latch 162 latches data in response to the rising sense signal DSRP. The sixth latch 163 latches data and allocates the data to the third data line DL3 in response to the falling sense signal DSFP. The seventh latch 164 latches data and allocates the data to the fourth data line DL4 in response to the falling sense signal DSFP. The global I/O transfer unit 170 outputs the data allocated to the first to fourth data lines DL1 to DL4 to a global I/O bus GIO in response to a strobe pulse DCLK. FIG. 2 is a timing diagram illustrating a data write operation of the data write apparatus show in FIG. 1. The rising sense signal DSRP is generated in synchronization with the rising edge of the data strobe pulse DQS. The falling sense signal DSFP is generated in synchronization with the falling edge of the data strobe pulse DQS. The data D1 to D4 are input to the data input buffer 130 through the input terminal DQ. The input data are latched in the first latch 151 by the rising sense signal DSRP through the second delay unit 140. The data are then latched in the third latch 153 by the falling sense signal DSFP and are then allocated to the first data line DL1. At this time, the second data D2 are latched in the second latch 152 in synchronization with the falling sense signal DSFP and are allocated to the second data line DL2. In a next rising clock, the first and second data D1 and D2 allocated to the first and second data lines DL1 and DL2 are respectively latched in the fourth latch 161 and the fifth latch 162. At the same time, the third data D3 are latched in the first latch 151. The third data D3 are latched in the third latch 153 and are allocated to the first data line DL1 by a next falling sense signal DSFP. The fourth data D4 are latched in the second latch 152 and are allocated to the second data line DL2 by the next falling sense signal DSFP. Furthermore, the first and second data D1 and D2 are latched in the sixth and seventh latches 163 and 164, respectively, and are allocated to the third data line DL3 and the fourth data line DL4, respectively. Accordingly, the first to fourth data lines DL1 to DL4 are respectively allocated with the third data D3, the fourth data D4, the first data DL1 and the second data DL2. Furthermore, if the strobe pulse DCLK is enabled, the data D1 to D4 are all output to the global I/O line GIO. Through the above operation, the data are latched through the third data line DL3, the fourth data line DL4, the first data line DL1, and the second data line DL2 in parallel. Accordingly, this method is called a parallel register scheme. However, this scheme increases the area of a circuit since the number of lines for transferring signals is increased. Furthermore, since the number of operating circuits increases, power consumption is increased.

SUMMARY OF THE INVENTION

Accordingly, the present invention provides a writing apparatus capable of reducing the number of data lines and the number of latches at the time of a writing operation.

A writing apparatus of a semiconductor memory device according to an aspect of the present invention includes a pulse generator for outputting a first pulse every rising edge of a data strobe pulse and a second pulse every falling edge of the data strobe pulse, respectively; a latch unit for latching input data every rising edge of the first pulse, latching the latched data and input data every rising edge of the second pulse, respectively, and allocating the respective latched data to first and second data lines; and an output latch unit for latching data, which are firstly allocated to the first and second data lines, in response to a first control signal, and latching data, which are secondly allocated to the first and second data lines, in response to a second control signal.

A writing apparatus of a semiconductor memory device according to an other aspect of the present invention includes a data input buffer for buffering data; a second delay unit for controlling a set-up hold time of data output from the data input buffer; a data strobe buffer for buffering a data strobe signal; a first delay unit for outputting a first pulse, which rises every rising edge of the data strobe signal output from the data strobe buffer, and a second pulse, which rises every falling edge of the data strobe signal output from the data strobe buffer; a first latch for latching data output from the second delay unit in response to the first pulse; a second latch for latching data output from the second delay unit in response to the second pulse, and allocating the latched data to a first data line; a third latch for latching an output of the first latch in response to the second pulse, and allocating the latched output to a second data line; a data clock buffer for buffering a clock signal; a first control unit for outputting a first control signal in response to an output of the data clock buffer; a shift register for shifting an output of the data clock buffer; a second control unit for generating a second control signal in response to an output of the shift register; and an output latch unit for latching the data allocated to the first and second data lines in response to the first control signal and the second control signal, respectively.

DESCRIPTION OF SPECIFIC EMBODIMENTS

Now, specific embodiments according to the present patent will be described with reference to the accompanying drawings.

Figure 3:
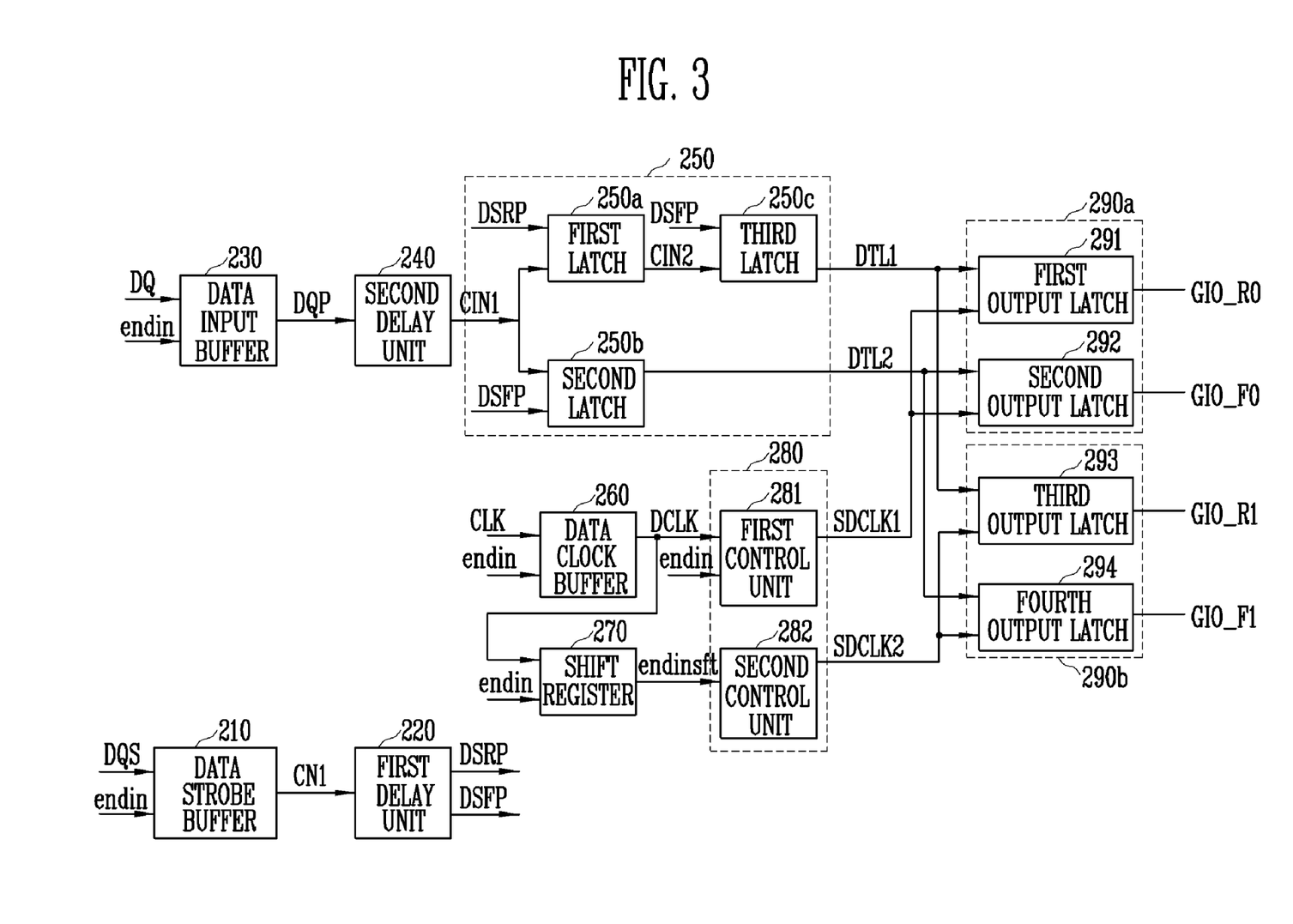
FIG. 3 is a block diagram schematically showing a data write apparatus in DDR SDRAM according to the present invention.

FIG. 3 is a schematic block diagram of a data write apparatus in DDR SDRAM according to the present invention. The write apparatus includes a data strobe buffer 210, a first delay unit 220, a data input buffer 230, a second delay unit 240, a latch unit 250, a data clock buffer 260, a shift register 270, a control unit 280, a first output latch unit 290a and a second output latch unit 290b. The data strobe buffer 210 buffers a data strobe pulse DQS and outputs a first transfer signal CN1 in response to an enable signal endin. The first delay unit 220 outputs a rising sense signal DSRP and a falling sense signal DSFP in response to the first transfer signal CN1. The data input buffer 230 receives data through an input terminal DQ, buffers the data and outputs a second transfer signal CN2 in response to an enable signal endin. The second delay unit 240 transfers data to a first input line CIN1 in response to the second transfer signal CN2. The latch unit 250 includes first to third latches 250a to 250c. The first latch 250a latches first data D1 of the first input line CIN1 and allocates the first data D1 to a second input line CIN2 in response to the rising sense signal DSRP. The second latch 250b latches second data D2 and allocates the second data D2 to a second data line DTL2 in response to the falling sense signal DSFP. Simultaneously with the operation of the second latch 250b, the third latch 250c latches the first data D1 allocated to the second input line CIN2 and allocates the first data D1 to the first data line DTL1 in response to the falling sense signal DSFP. The data clock buffer 260 outputs a strobe pulse DCLK in response to an external clock CLK and the enable signal endin. The shift register 270 outputs a shift enable signal endinsft in response to the strobe pulse DCLK and the enable signal endin. The control unit 280 further includes a first control unit 281 and a second control unit 282.

The first control unit 281 receives the strobe pulse DCLK and outputs a first input control signal SDCLK1 in response to the enable signal endin. The second control unit 282 outputs a second input control signal SDCLK2 in response to the shift enable signal endinsft and Vdd. At this time, since the shift register 270 operates in response to the strobe pulse DCLK, the second input control signal SDCLK2 is output one clock cycle later than the first input control signal SDCLK1. The first output latch unit 290a includes first and second output latches 291 and 292. The second output latch unit 290b includes third and fourth output latches 293 and 294. If the first input control signal SDCLK1 is enabled, the first output latch 291 and the second output latch 292 latch the data D1 and D2 allocated to the first data line DTL1 and the second data line DTL2 and output them to global I/O lines GIO_R0 and GIO_F0. If the second input control signal SDCLK2 is enabled, the third output latch 293 and the fourth output latch 294 latch the data D3 and D4 allocated to the first data line DTL1 and the second data line DTL2 and output them to global I/O lines DIO_R1 and GIO_F1.

Figure 4:
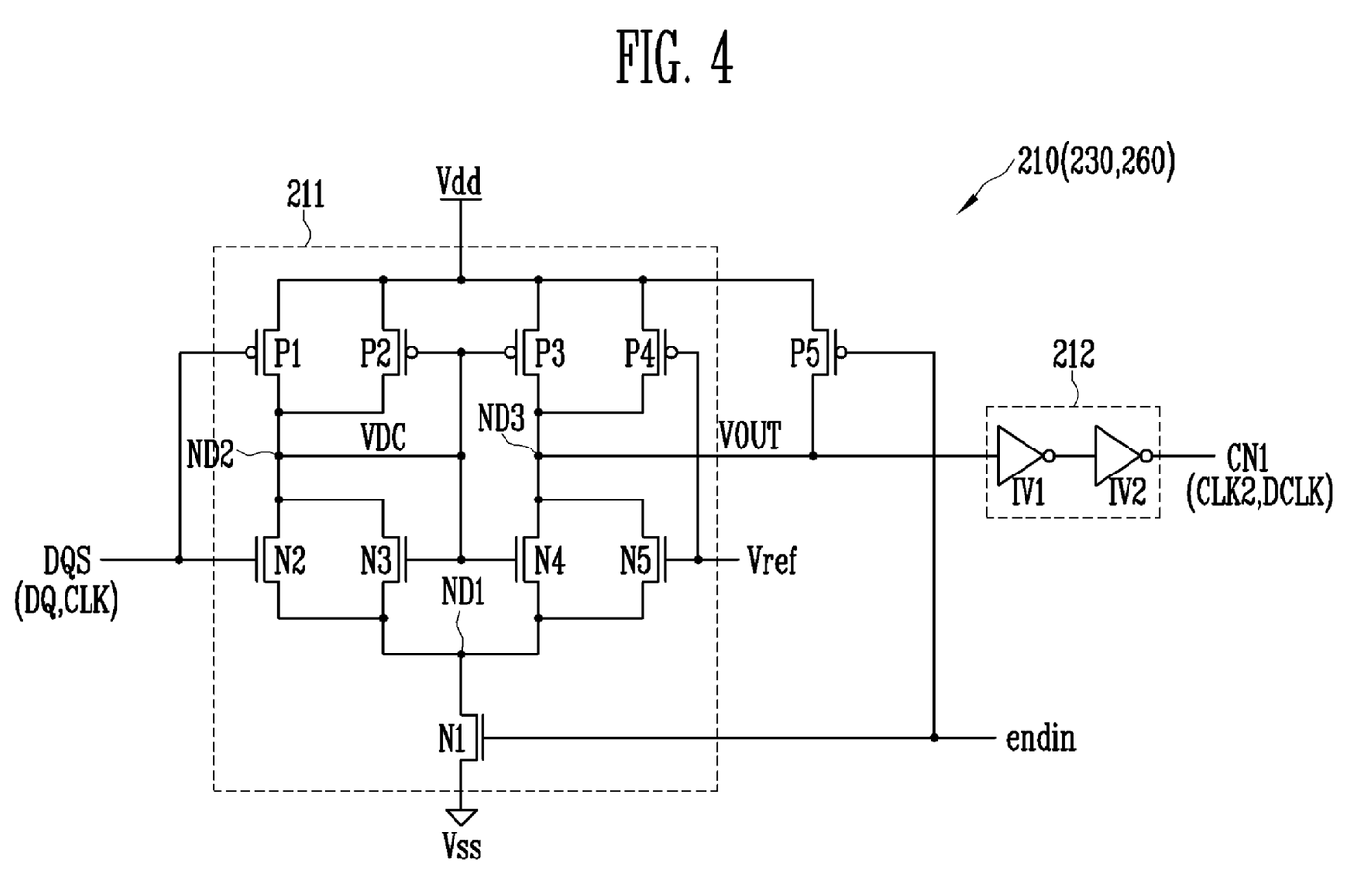
FIG. 4 is a detailed circuit diagram of one of buffer circuits shown in FIG. 3.

FIG. 4 is a detailed circuit diagram of one of the buffer circuits shown in FIG. 3. The construction of the buffer circuit shown in FIG. 4 is similar to that of the data strobe buffer 210, the data input buffer 230 and the data clock buffer 260. The data strobe buffer 210 will be described below as an example. The data strobe buffer 210 includes a differential amplifier 211, a buffer unit 212 and a disable element P5. The differential amplifier 211 includes a plurality of PMOS transistors P1 to P4 and a plurality of NMOS transistors N1 to N5. If the enable signal endin is enabled, the first NMOS transistor N1 is turned on to reset a first node ND1. The first PMOS transistor P1 and the second NMOS transistor N2 apply voltages to the second node ND2 and output a mirror signal VDC in response to the data strobe pulse DQS. The second and third PMOS transistors P2 and P3 and the third and fourth NMOS transistors N3 and N4 operate in response to the mirror signal VDC and apply a differential output signal VOUT to the third node ND3. The fourth PMOS transistor P4 and the fifth NMOS transistor N5 transfer a small reference current to the third node ND3 in response to a reference voltage Vref. The reference voltage Vref is a voltage having an intermediate value between a high level and a low level of the data strobe pulse DQS. The buffer unit 212 includes first and second inverters IV1 and IV2. The inverters IV1 and IV2 buffer a differential output signal VOUT and output a first transfer signal CN1. When the enable signal endin is disabled, the fifth PMOS transistor P5 makes the differential output signal VOUT a high level and outputs the first transfer signal CN1 as high level. In the case where the circuit shown in FIG. 4 is the data input buffer 230, the circuit receives data through the input terminal DQ and outputs the data to the second transfer signal CN2. Furthermore, in the case where the circuit shown in FIG. 4 is the data clock buffer 260, the circuit receives the external clock CLK and outputs it to the strobe pulse DCLK.

Figure 5:
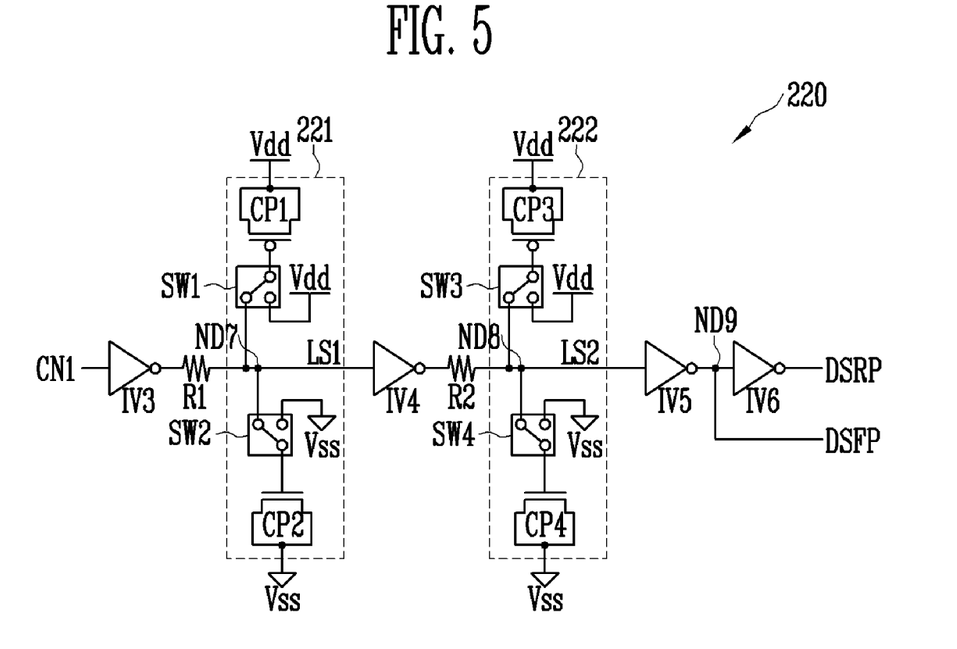
FIG. 5 is a detailed circuit diagram of a first delay unit shown in FIG. 3.

FIG. 5 is a detailed circuit diagram of the first delay unit shown in FIG. 3. The first delay unit 220 includes a plurality of inverters IV3 to IV6, a plurality of resistors R1 and R2, and first and second switching elements 221 and 222. The first switching element 221 includes first and second capacitors CP1 and CP2 and first and second switches SW1 and SW2. When a high period of a first logic signal LS1 is shorter than a low period of the first logic signal LS1, the first switch SW1 transfers the first logic signal LS1 to the first capacitor CP1. When the high period of the first logic signal LS1 is longer than the low period of the first logic signal LS1, the second switch SW2 transfers the first delay signal LS1 to the second capacitor CP2. The second switching element 222 includes third and fourth capacitors CP3 and CP4 and third and fourth switches SW3 and SW4. When a high period of a second delay signal LS2 is shorter than a low period of the second delay signal LS2, the third switch SW3 transfers the second delay signal LS2 to the third capacitor CP3. When the high period of the second delay signal LS2 is longer than the low period of the second delay signal LS2, the fourth switch SW4 transfers the second delay signal LS2 to the fourth capacitor CP4. The second delay signal LS2 is output as the falling sense signal DSFP by the inverter IV5. The second delay signal LS2 is buffered by two inverters IV5 and IV6 and is then output as the rising sense signal DSRP.

Figure 6:
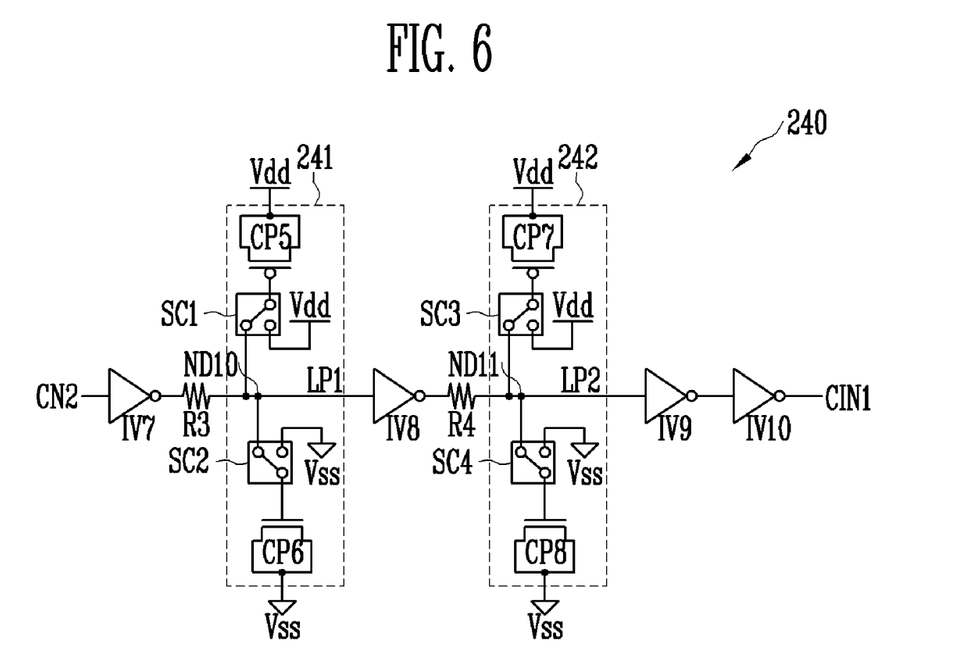
FIG. 6 is a detailed circuit diagram of a second delay unit shown in FIG. 3.
Figure 7:
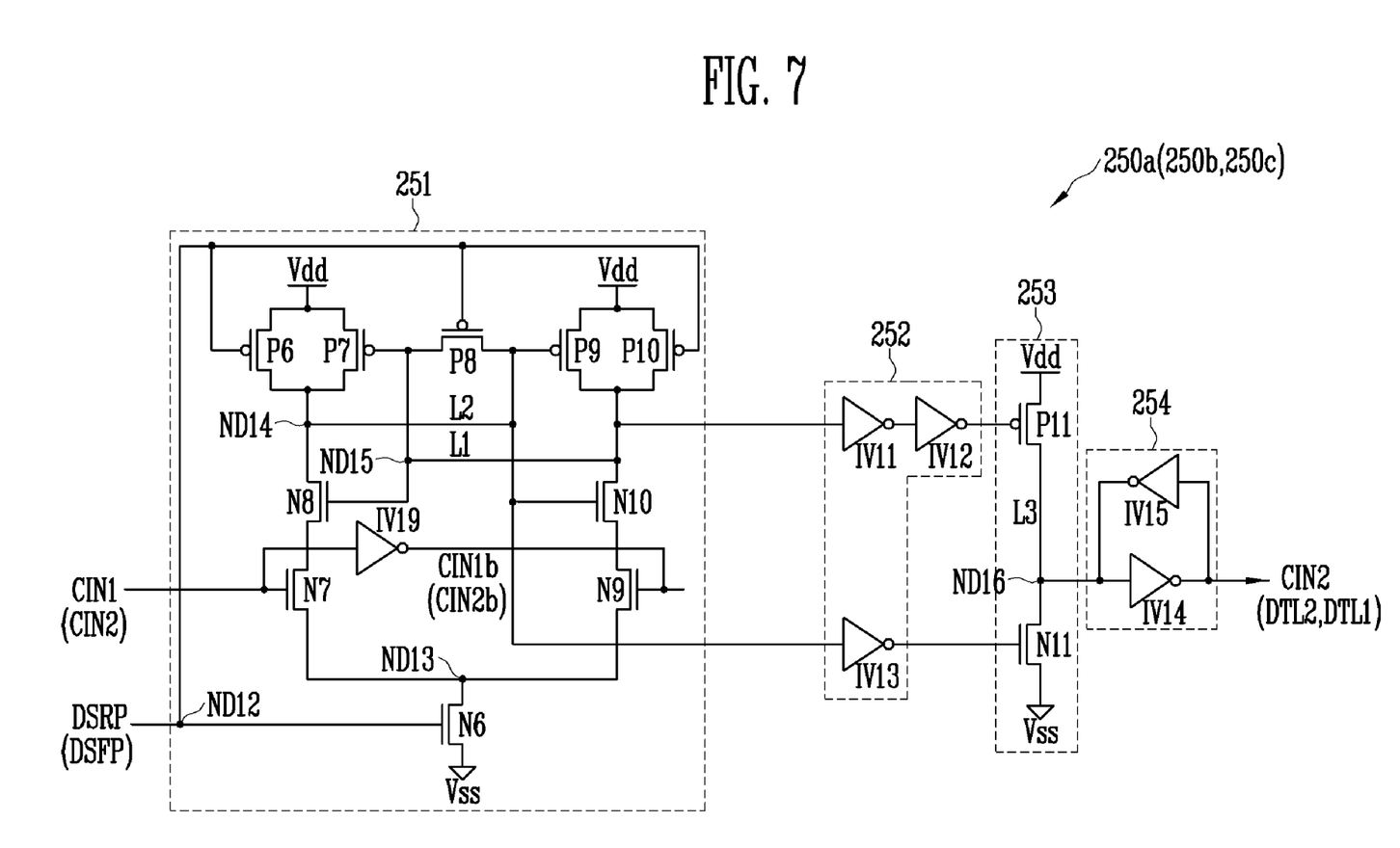
FIG. 7 is a detailed circuit diagram of a latch circuit shown in FIG. 3.

FIG. 6 is a detailed circuit diagram of the second delay unit shown in FIG. 3. The second delay unit 240 operates in a similar manner as the first delay unit 220 and therefore will not be described. FIG. 7 is a detailed circuit diagram of the latch circuit shown in FIG. 3. The construction of the first to third latches 250a to 250c shown in FIG. 7 are similar to each other. Of them, the first latch 250a will be described below as an example. The first latch 250a includes a differential amplifier 251, a buffer unit 252, an output driver 253 and a latch unit 254. The differential amplifier 251 includes a plurality of PMOS transistors P6 to P10, a plurality of NMOS transistors N6 to N10 and an inverter IV19. The NMOS transistor N6 connects a node ND13 and a ground voltage Vss in response to the rising sense signal DSRP. The NMOS transistors N7 and N8 connect a node ND14 and the node ND13 in response to the first input signal CIN1 and the first logic signal L1, respectively. The PMOS transistors P6 and P7 form a current mirror that connects the power supply voltage Vdd and the node ND14 in response to the rising sense signal DSRP and the first logic signal L1, respectively. The PMOS transistor P8 connects the nodes ND14 and ND15 in response to the rising sense signal DSRP. The NMOS transistors N9 and N10 connect the nodes ND15 and ND13 in response to the inverted first input signal CIN1b and the second logic signal L2, respectively. The PMOS transistors P9 and P10 connect a power supply voltage Vdd and the node ND15 in response to the second logic signal L2 and the rising sense signal DSRP, respectively. When the rising sense signal DSRP is a low level, both the PMOS transistors P6 and P10 are turned on, so that voltage levels of the nodes ND14 and ND15 become a high level. If the rising sense signal DSRP is enabled to a high level, the PMOS transistors P6 and P10 are turned off and the first and second logic signals L1 and L2 are kept to a high level. The NMOS transistors N7 and N9 are driven to output the first and second logic signals L1 and L2 in response to the first input signal CIN1 and inverted first input signal CIN1b. The output logic signals L1 and L2 are buffered through the buffer unit 252 and are applied to the output driver 253. The output driver 253 includes a PMOS transistor P11 and a NMOS transistor N11. As the transistors P11 and N11 operate, data are applied to the node ND16, and the latch unit 254 latches data and allocates the data to the second input line CIN2.

Figure 8:
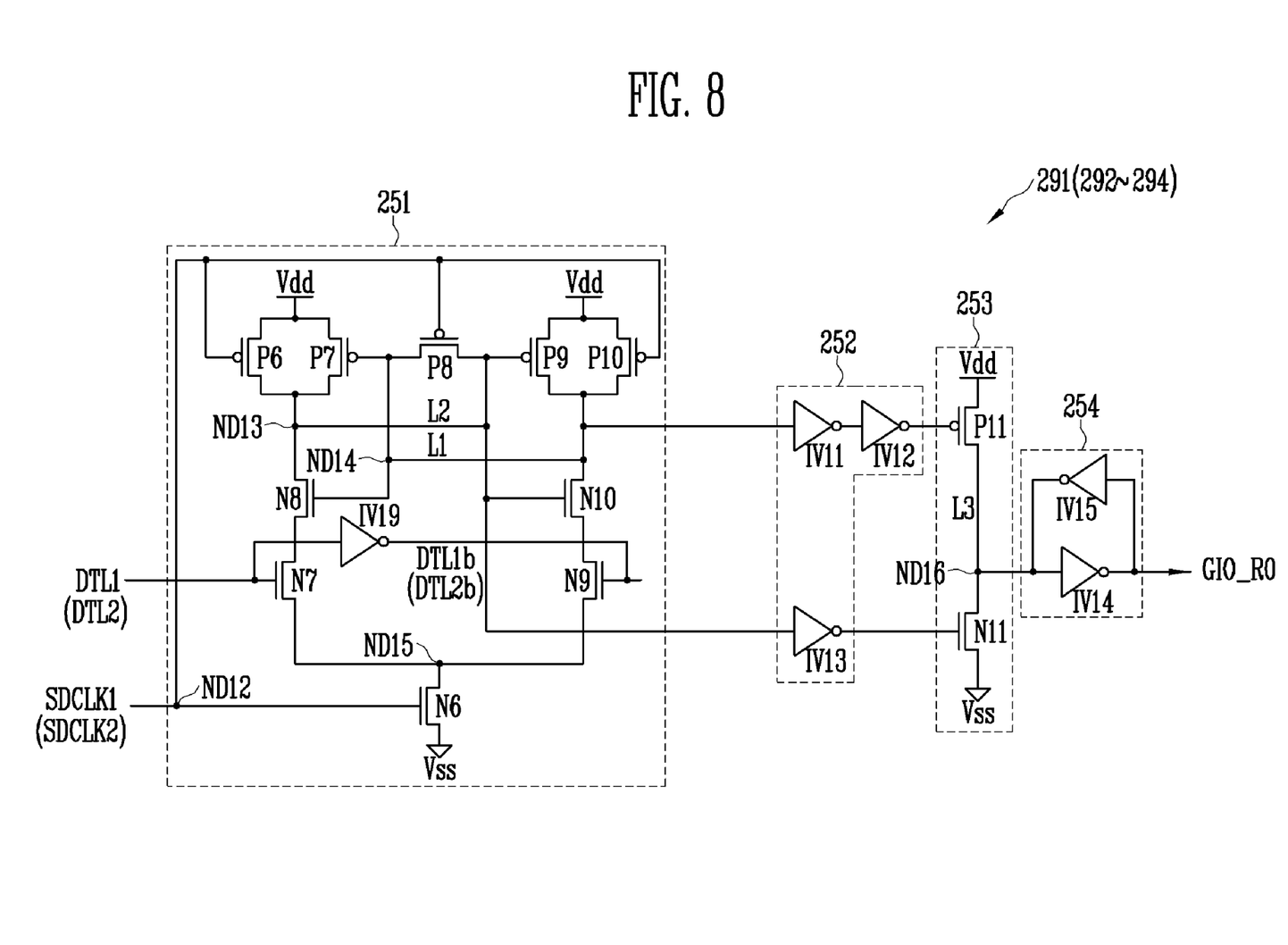
FIG. 8 is a detailed circuit diagram of an output latch shown in FIG. 3.
Figure 9:
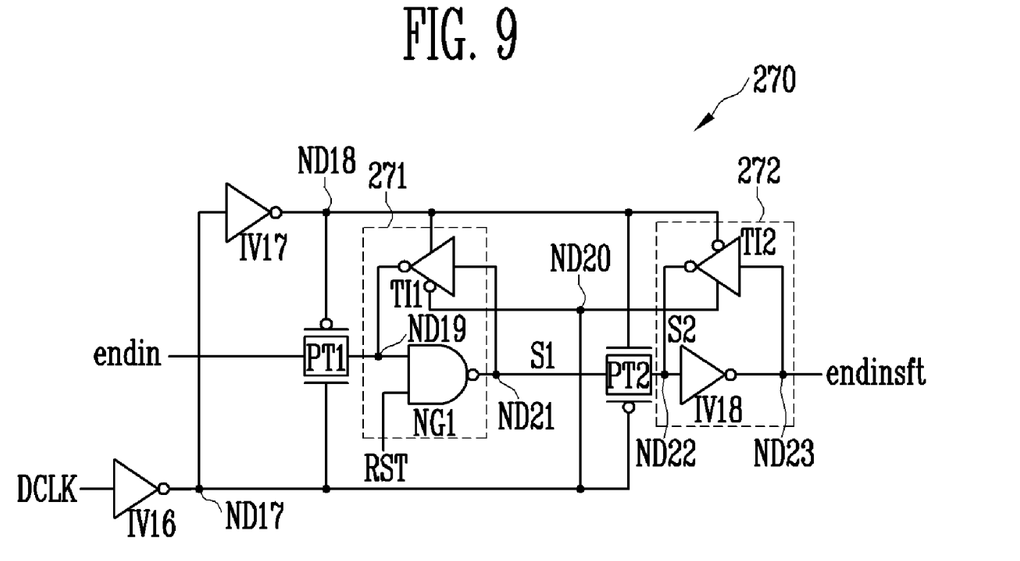
FIG. 9 is a detailed circuit diagram of a shift register shown in FIG. 3.

FIG. 8 is a detailed circuit diagram of the first to fourth output latches 291 to 294 shown in FIG. 3. The first to fourth output latches 291 to 294 have the same construction as that of and also operate in the same manner as the latch circuit of FIG. 7, and therefore will not be described. FIG. 9 is a detailed circuit diagram of the shift register shown in FIG. 3. The shift register 270 includes a plurality of inverters IV16 and IV17, first and second transfer gates PT1 and PT2, a first latch unit 271 and a second latch unit 272. The inverters IV16 and IV17 invert the strobe pulse DCLK applied thereto. The first transfer gate PT1 transfers the enable signal endin to the node ND19 in response to the strobe pulse DCLK. The first latch unit 271 further includes a three-phase inverter TI1 and a first NAND gate NG1. The three-phase inverter TI1 inverts the first logic signal S1 and applies it to the node ND19, in response to the strobe pulse DCLK. The NAND gate NG1 outputs a fourth logic signal S1 in response to a voltage level of the node ND19 and a reset signal RST. The second transfer gate PT2 transfers the first logic signal S1 to the second latch unit 272 in response to the strobe pulse DCLK. The second latch unit 272 includes an inverter IV18 and a three-phase inverter TI2. The inverter IV18 inverts the first logic signal S2 applied to the node ND22 and outputs it as the shift enable signal endinsft. The three-phase inverter TI2 inverts the shift enable signal endinsft and outputs the second logic signal S2 to the node ND22 in response to the strobe pulse DCLK. In the shift register 270, if the strobe pulse DCLK is enabled, the first transfer gate PT1 transfers the enable signal endin to the first latch unit 271, so that the first logic signal S1 is output. If the level of the strobe pulse DCLK is changed, the first logic signal S1 is latched in the first latch unit 271, and the second transfer gate PT2 transfers the first logic signal S1 to the second latch unit 272, so that the shift enable signal endinsft is output.

Figure 10:
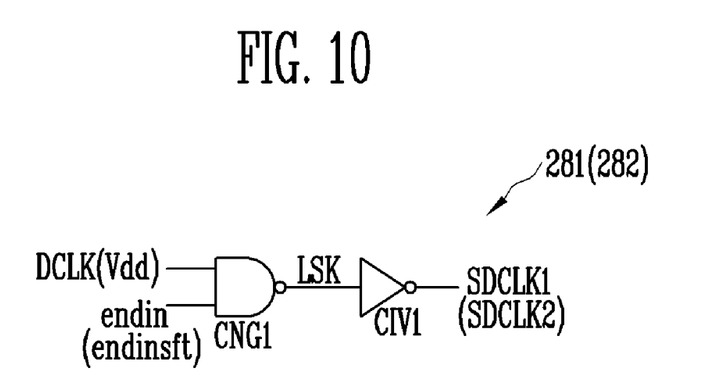
FIG. 10 is a detailed circuit diagram of a control unit shown in FIG. 3.

FIG. 10 is a detailed circuit diagram of the control units 281 and 282 shown in FIG. 3. The construction of the first control unit 281 and the second control unit 282 are similar. Of them, the first control unit 281 will be described below as an example. The first control unit 281 includes a NAND gate CNG1 and an inverter CIV1. The NAND gate CNG1 outputs a logic signal LSK in response to the strobe pulse DCLK and the enable signal endin. In more detail, when both the strobe pulse DCLK and the enable signal endin are a high level, the NAND gate CNG1 outputs the logic signal LSK at a low level. Furthermore, when both the strobe pulse DCLK and the enable signal endin have different levels or are a low level, the NAND gate CNG1 outputs the logic signal LSK at a high level. The inverter CIV1 inverts the logic signal LSK and outputs the first input control signal SDCLK1. When the circuit shown in FIG. 10 is the second control unit 282, the circuit outputs the second input control signal SDCLK2 in response to the shift enable signal endinsft and the power supply voltage Vdd.

Figure 11:
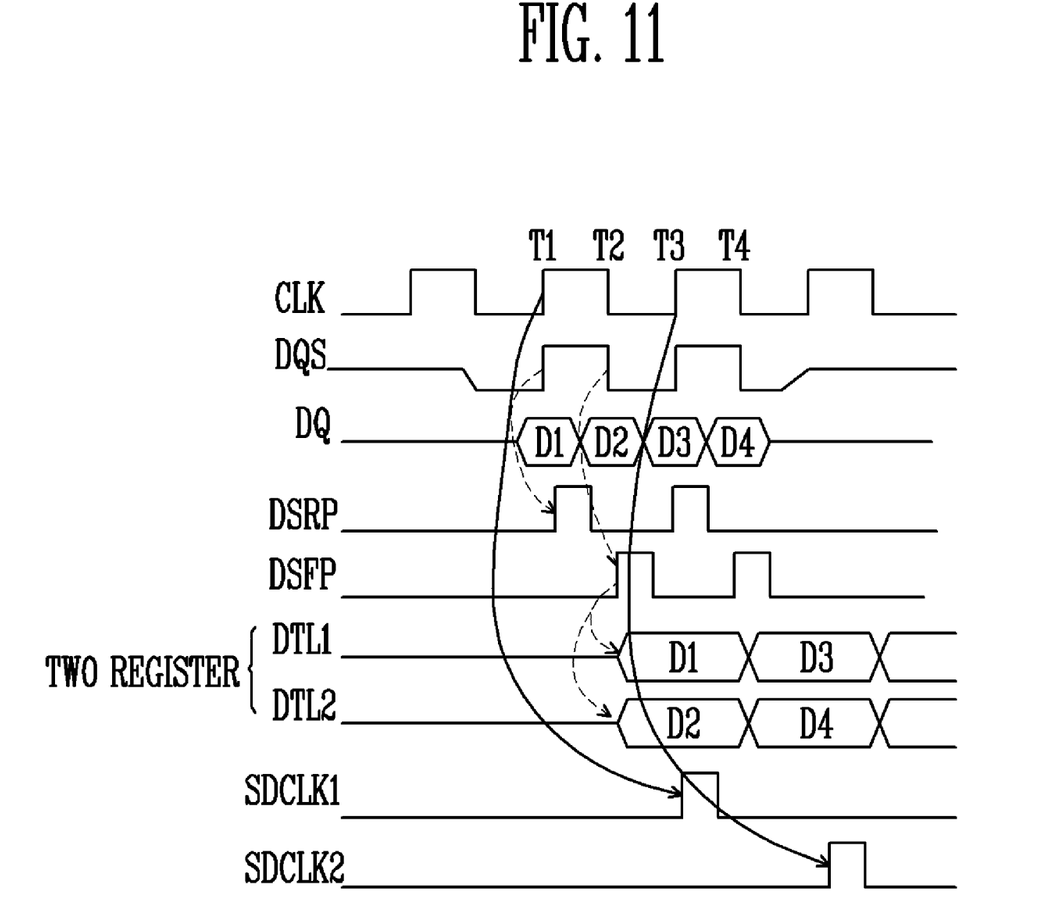
FIG. 11 is a timing diagram illustrating a data write operation of the data write apparatus shown in FIG. 3.

FIG. 11 is a timing diagram illustrating a data write operation of the data write apparatus shown in FIG. 3. The rising sense signal DSRP is generated in synchronization with a rising edge T1 of the data strobe pulse DQS. The falling sense signal DSFP is generated in synchronization with a falling edge T2 of the data strobe pulse DQS. The data D1, D2, D3 and D4 are input to the data input buffer 230 in series through the input terminal DQ in synchronization with the data strobe pulse DQS. If the rising sense signal DSRP is enabled in the first latch 250a, the first data D1 are latched in the first latch 250a. If the falling sense signal DSFP is enabled in the second latch 250b and the third latch 250c, the second latch 250b latches the second data D2 and the third latch 250c latches the first data D1 from the first latch 250a. Accordingly, the first data line DTL1 is allocated with the first data D1 and the second data line DTL2 is allocated with the second data D2. If a rising pulse of the external clock CLK is applied, the data clock buffer 260 outputs the strobe pulse DCLK at a high level. The first input control signal SDCLK1 is output as a high level if the strobe pulse DCLK of a high level is applied with the first control unit 281 being enabled. The first output latch 291 and the second output latch 292 receive the first data D1 and the second data D2 and output data to the global I/O lines GIO_R0 and GIO_F0, respectively, in response to the first input signal SDCLK1 of a high level. The third data D3 and the fourth data D4 are allocated to the first data line DTL1 and the second data line DTL2, respectively, in the same manner. The shift register 270 outputs the shift enable signal endinsft at a high level in response to the strobe pulse DCLK of a high level. Accordingly, the second input control signal SDCLK2 is generated one clock later than the first input control signal SDCLK1 and is then applied to the third latch 293 and the fourth latch 294. Therefore, the first data D1 and the second data D2 are output through the global I/O lines GIO_R0 and GIO_F0 and the third data D3 and the fourth data D4 are then output through the global I/O lines GIO_R1 and GIO_F1. Furthermore, the first to fourth output latches 291 to 294 may be implemented using two or more output latches. In this case, they can output data to two global I/O lines.

As described above, in accordance with the write apparatus of the DDR SDRAM according to the present invention, the write operation of data can be performed using two registers. It is thus possible to reduce the number of data lines and therefore to reduce the number of the latch.

Although the foregoing description has been made with reference to the various embodiments, it is to be understood that changes and modifications of the present patent may be made those having ordinary skill in the art without departing from the spirit and scope of the present patent and appended claims.

What is claimed is:

1. A writing apparatus of a semiconductor memory device, comprising:
    a pulse generator for outputting a first pulse every rising edge of a data strobe pulse and a second pulse every falling edge of the data strobe pulse, respectively;
    a latch unit for latching input data every rising edge of the first pulse, latching the latched data and input data every rising edge of the second pulse, respectively, and allocating the respective latched data to first and second data lines; and
    an output latch unit for latching data, which are firstly allocated to the first and second data lines, in response to a first control signal, and latching data, which are secondly allocated to the first and second data lines, in response to a second control signal.

2. The writing apparatus of claim 1, wherein the pulse generator comprises:
    a data strobe buffer for buffering the data strobe pulse; and
    a delay unit for outputting the first and second pulses in response to an output of the data strobe buffer.

3. The writing apparatus of claim 1, wherein the latch unit comprises:
    a first latch for latching a first input data in response to the first pulse;
    a second latch for latching a second input data in response to the second pulse; and
    a third latch for latching an output of the first latch in response to the second pulse.

4. The writing apparatus of claim 1, wherein:
    the first control signal is generated by a first control unit that operates in response to a clock signal, and
    the second control signal is generated by a shift register for shifting an enable signal in response to the clock signal and a second control unit that operates in response to an output of the shift register.

5. The writing apparatus of claim 1, wherein the output latch unit comprises four or more latches.

6. A writing apparatus of a semiconductor memory device, comprising:
    a data input buffer for buffering data;
    a second delay unit for controlling a set-up hold time of data output from the data input buffer;
    a data strobe buffer for buffering a data strobe signal;
    a first delay unit for outputting a first pulse, which rises every rising edge of the data strobe signal output from the data strobe buffer, and a second pulse, which rises every falling edge of the data strobe signal output from the data strobe buffer;
    a first latch for latching data output from the second delay unit in response to the first pulse;
    a second latch for latching data output from the second delay unit in response to the second pulse, and allocating the latched data to a first data line;
    a third latch for latching an output of the first latch in response to the second pulse, and allocating the latched output to a second data line;
    a data clock buffer for buffering a clock signal;
    a first control unit for outputting a first control signal in response to an output of the data clock buffer;
    a shift register for shifting an output of the data clock buffer;
    a second control unit for generating a second control signal in response to an output of the shift register; and
    an output latch unit for latching the data allocated to the first and second data lines in response to the first control signal and the second control signal, respectively.

7. The writing apparatus of claim 6, wherein each of the data input buffer, the data clock buffer and the data strobe buffer comprises:
    a differential amplifier for amplifying a difference between a reference voltage and an input signal in response to the enable signal;
    a buffer for buffering an output of the differential amplifier; and
    a switching element for switching an output of the buffer to a high level in response to the enable signal.

8. The writing apparatus of claim 6, wherein the first delay unit comprises:
    a first delay circuit for controlling a low level period and a high level period of a signal output from the data strobe buffer;
    a second delay circuit for controlling a low level period and a high level period of a signal output from the first delay circuit;
    a first inverter for inverting an output of the second delay circuit and generating the second pulse; and
    a second inverter for inverting an output of the first inverter and generating the first pulse.

9. The writing apparatus of claim 6, wherein the second delay comprises:
    a first delay circuit for controlling a low level period and a high level period of a signal output from the input buffer;
    a second delay circuit for controlling a low level period and a high level period of a signal output from the first delay circuit;
    a first inverter for inverting an output of the second delay circuit and outputting an inverted output; and
    a second inverter for inverting an output of the first inverter and outputting an inverted output.

10. The writing apparatus of claim 6, wherein:
    the shift register comprises first and second latches,
    the first latch latches an enable signal in response to an output of the data clock buffer, and
    the second latch latches a data of the first latch in response to an output of the data clock buffer.

11. The writing apparatus of claim 6, wherein the first control unit comprises:

a first logic element for inverting an enable signal in response to an output of the data clock buffer; and an inverter for inverting an output of the first logic element.

12. The writing apparatus of claim 6, wherein the second control unit comprises:

a first logic element for inverting an output of the shift register; and an inverter for inverting an output of the first logic element.

13. The writing apparatus of claim 6, wherein each of the first, second and third latches comprises:

a differential amplifier configured to operate in response to the first pulse or the second pulse, and output a high level signal or a low level signal depending on the level of an input data;

a driver for outputting a low or high level signal in response to an output of the differential amplifier; and a latch for outputting an output of the driver.

* * * * *